US012672244B2

(12) United States Patent     (10) Patent No.:   US 12,672,244 B2

Harris et al.     (45) Date of Patent:   Jun. 30, 2026

(54) MOUNT FOR VEHICLE ELECTRIC CONTROL MODULE

(71) Applicants:DENSO International America, Inc., Southfield, MI (US); DENSO CORPORATION, Kariya (JP)

(72) Inventors: Justin Harris, Southfield, MI (US); Nikolai Akinin, Canton, MI (US)

(73) Assignees: DENSO International America, Inc., South Field, MI (US); DENSO CORPORATION (JP)

( * ) Notice: Subject to any disclaimer, the term of this patent is extended or adjusted under 35 U.S.C. 154(b) by 401 days.

(21) Appl. No.: 18/543,838

(22) Filed: Dec. 18, 2023

(65) Prior Publication Data

US 2024/0317160 A1   Sep. 26, 2024

Related U.S. Application Data

(60) Provisional application No. 63/454,076, filed on Mar. 23, 2023.

(51) Int. Cl.
H05K 5/02     (2006.01)

(52) U.S. Cl.
CPC .................................. H05K 5/0204 (2013.01)

(58) Field of Classification Search
CPC .................................................. H05K 5/0204
USPC ......................................................... 174/545
See application file for complete search history.

(56) References Cited

U.S. PATENT DOCUMENTS

| | | | | |
|---|---|---|---|---|
| 2,979,554 | A * | 4/1961 | Maitland | .................. H05K 7/12 439/82 |
| 3,025,337 | A * | 3/1962 | Leoni | ...................... F21V 23/02 174/545 |
| 7,718,892 | B2 * | 5/2010 | Warren | ................ H05K 5/0073 361/801 |
| 8,492,663 | B2 * | 7/2013 | Nishiyama | ............. H02G 3/086 174/545 |
| 10,836,316 | B2 * | 11/2020 | Asang | ........................ B60R 1/04 |
| 2003/0184108 | A1 | 10/2003 | Donovan et al. | |
| 2013/0214548 | A1 * | 8/2013 | Harders | .............. B60R 13/0212 296/24.34 |
| 2024/0300425 | A1 * | 9/2024 | Caprotti | ............... H02G 15/013 |

FOREIGN PATENT DOCUMENTS

| | | |
|---|---|---|
| CN | 216563504 U | 5/2022 |
| JP | 2022155010 A | 10/2022 |

* cited by examiner

*Primary Examiner* — Stanley Tso
(74) *Attorney, Agent, or Firm* — Dickinson Wright PLLC

(57)      ABSTRACT

A mount for mounting a vehicle electric control module to a vehicle structure, the mount includes: a base configured to couple to the vehicle electric control module; a clip coupled to the base, the clip including a cantilever extending from the base and a snap coupled to the cantilever to be spaced apart from the base, the snap including an engagement surface facing the base and configured to engage the vehicle structure with a snap fit; and a hook coupled to the base, the hook including a contact surface facing the base and configured to contact the vehicle structure.

13 Claims, 3 Drawing Sheets

MOUNT FOR VEHICLE ELECTRIC CONTROL MODULE

CROSS-REFERENCE TO RELATED APPLICATION

The present disclosure claims the benefit of Provisional Patent Application No. 63/454,076, filed on Mar. 23, 2023 and entitled "MOUNT FOR VEHICLE ELECTRIC CONTROL MODULE", the contents of which are incorporated by reference in its entirety.

TECHNICAL FIELD

The present disclosure relates to mounting structures and, more specifically, mounting structures for vehicle electric control modules.

BACKGROUND

Vehicles include vehicle electric control modules for performing automated and computer-based tasks of the vehicle and for controlling electrical systems/sub-systems, such as controlling cruise control, activating the wipers, activating HVAC functions, lighting, and various other functions. The vehicle electric control modules are mounted to a rigid structure of the vehicle and connected by wires to the various other structures of the vehicle for performing the above tasks. Traditional mounts for vehicle electric control modules use one or more fasteners to mount the vehicle electric control module to the vehicle. The use of fasteners increases the number of parts and added assembly time of inserting and tightening the fastener. Further, traditional integrated mounting features fail to form a rigid connection with the vehicle structure, causing movement of the mount and, therefore, rattle or noise from contact between the mount and the vehicle structure. As such, a need exists for an improved mount for a vehicle electric control module.

SUMMARY

According to a first aspect, a mount for mounting a vehicle electric control module to a vehicle structure, the mount includes: a base configured to couple to the vehicle electric control module; a clip coupled to the base, the clip including a cantilever extending from the base and a snap coupled to the cantilever to be spaced apart from the base, the snap including an engagement surface facing the base and configured to engage the vehicle structure; and a hook coupled to the base, the hook including a contact surface facing the base and configured to contact the vehicle structure.

According to a second aspect, a mount for mounting a vehicle electric control module to a vehicle structure, the mount includes: a base configured to couple to the vehicle electric control module: a clip coupled to the base, the clip including a cantilevered snap extending from the base and an L-shaped bracket, the cantilevered snap configured to constrain movement in a Z-direction relative to the vehicle structure, and the L-shaped bracket configured to constrain movement in an Y-direction and a X-direction relative to the vehicle structure; and a hook coupled to the base and configured to slidably connect to the vehicle structure.

According to a third aspect, a mount for mounting a vehicle electric control module to a vehicle structure, the mount includes: a base configured to couple to the vehicle electric control module: a clip coupled to the base, the clip including a cantilever extending from the base and a snap coupled to the cantilever to be spaced apart from the base, the snap including an engagement surface facing the base and configured to engage the vehicle structure; and a plastic spring coupled to the base and configured to bias the base away from the vehicle structure.

Any of the above aspects may include any of the following features: The mount includes a biasing member configured to bias the base away from the vehicle structure, where the biasing member includes a plastic spring and a stop that limits compression of the biasing member. The clip includes an L-shaped bracket configured to brace against the vehicle structure and constrain movement of the clip relative to the vehicle structure, where the L-shaped bracket includes a support structure extending from base a distance that is less than a distance between a lower surface of the cantilevered snap and the base, crush ribbing configured to increase flexibility of the L-shaped bracket, and an arm extending from the snap toward the L-shaped bracket. The hook has a support structure that extends a distance from the base that is less than a distance between the contact surface and the base. The cantilevered snap includes an engagement surface facing the base that is configured to engage an underside of the vehicle structure, and the hook includes a contact surface facing the base that is configured to contact the underside of the vehicle structure.

DETAILED DESCRIPTION

Figure 1:
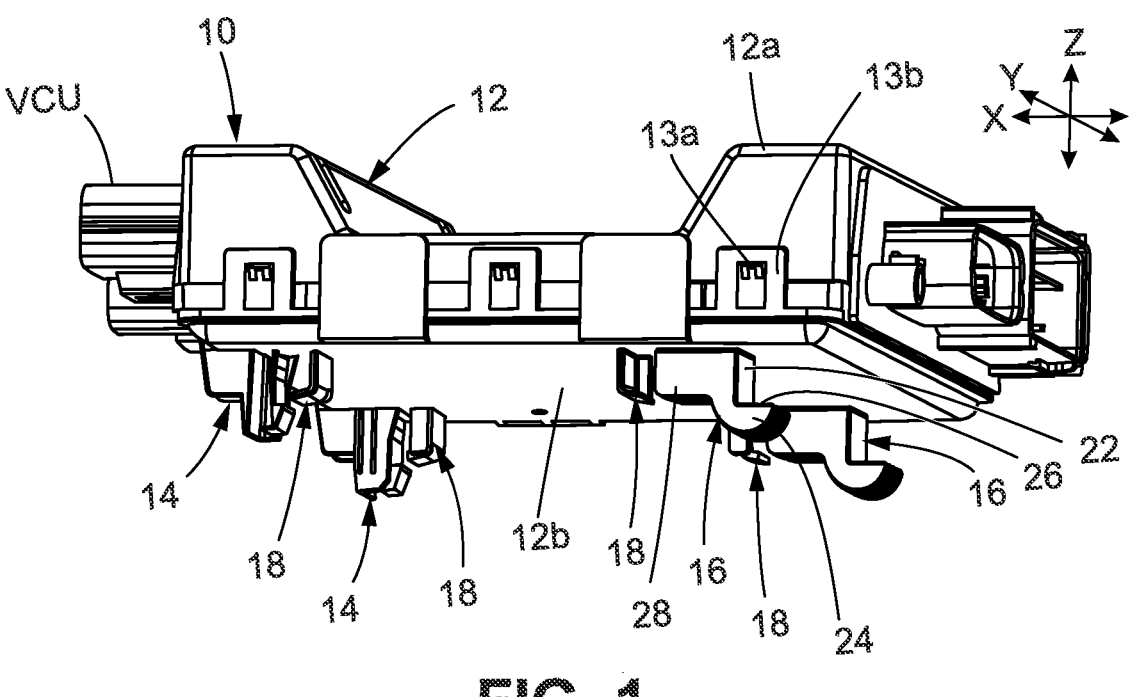
FIG. 1 schematically depicts a perspective view of a vehicle electric control module in a mount, according to one or more embodiments shown and described herein.
Figure 2:
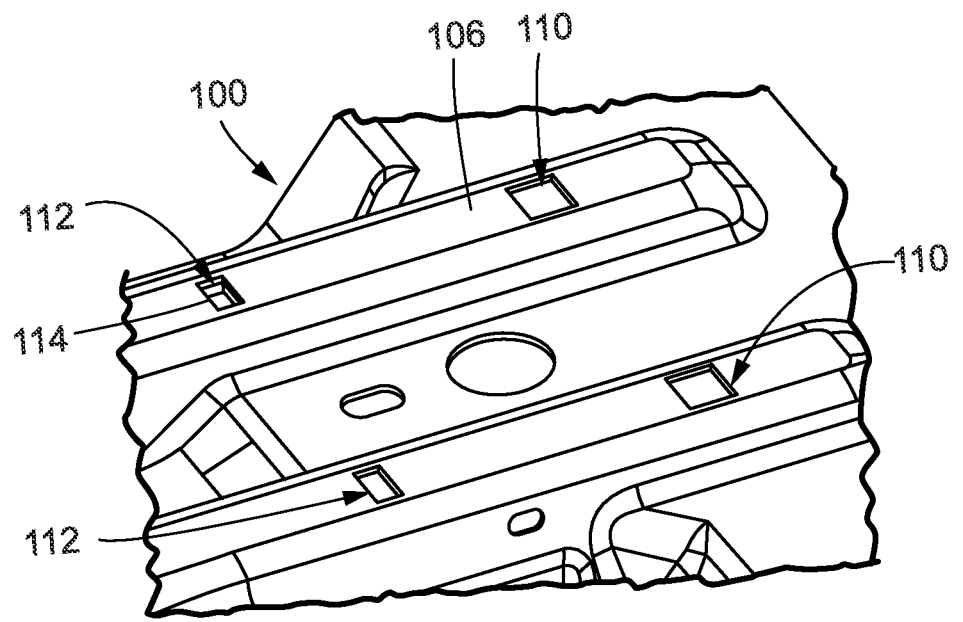
FIG. 2 schematically depicts a perspective view of a vehicle structure for receiving the mount of FIG. 1, according to one or more embodiments shown and described herein.

Referring initially to FIGS. 1 and 2, a mount 10 for mounting a vehicle electric control module (VCM) to a vehicle structure 100 are depicted. While a vehicle example is provided, the present disclosure is also applicable to non-vehicle implementations. The mount 10 may include a base 12, a pair of clips 14, a pair of hooks 16, and a plurality of biasing members 18. The clips 14 and the hooks 16 are each coupled to the base 12 to be configured to mount the base 12 of the mount 10 to the vehicle structure 100. As used herein, "coupled to" may include any method of attachment, such as by fasteners, by being integrally formed (e.g., molding) together as a monolithic, one-piece structure, or the like, unless a specific type of coupling is provided. The base 12 may be a shell for at least partially enclosing and fixedly couple to the VCM. The base 12 may be a two-part shell with each part being separately formed and selectively coupled together. For example, the base 12 may be a two-part structure including a first component 12a and a second component 12b that couple together to enclose and retain the VCM. The first component 12a and the second component 12b may each include male coupling features 13a and female coupling features 13b that couple to the male coupling features 13a. The male coupling features 13a may be protrusions extending from one of the first component 12a and the second component 12b. The female coupling features 13b may include a tab extending from one of the first component 12a and the second component 12b, where the tab defines an opening for receiving the male coupling feature 13a. The coupling features 13a, 13b may be attached together to couple the first component 12a to the second component 12b. The two-part structure may define a cavity 13 therein for receiving the VCM, wherein once the VCM is positioned in the cavity 13 between each part of the first component 12a and the second component 12b, the two parts of the structure may be coupled together through, for example, clips or fasteners 13a. 13b, to fixedly couple the VCM to the structure. The base 12 may include any operable number of clips 13a. 13b for coupling the two-part structures together. As depicted, the base 12 includes three fasteners 13a, 13b on each side. The base 12 may additionally include a hinge for rotatably coupling the two-part structure together on one side and include the fasteners 13a, 13b on the opposite side. It is further contemplated and possible that the base 12 is formed of more or less structures, such as three or one, where the base 12 is a single, one-piece monolithic structure. The base 12 may include an outer surface 20) that extends substantially in parallel with an outer surface 106 of the vehicle structure 100 when the mount 10 is attached to the vehicle structure 100.

Referring to FIG. 1 and as will be described in greater detail below; the clips 14 include a plurality of features that couple the base 12 to the vehicle structure 100 and constrain movement in a Y-direction, an X-direction, and a Z-direction. The hooks 16 may each include a stem 22 that extends perpendicularly from the base 12, and an overhang 24 that extends perpendicularly to the stem 22 to at least partially extend in parallel with the base 12. The overhang 24 may include a contact surface 26 that faces the base 12 and extends in parallel with the outer surface 20 of the base 12, and that is configured to contact the vehicle structure 100. The overhang 24 may extend from the stem 22 away from the pair of clips 14. In this configuration, the overhang 24 of the hooks 16 is inserted into holes in the vehicle structure 100 and the base 12 is moved such that the clips 14 move toward the holes to align the clips 14 with additional holes in the vehicle structure 100. However, it is contemplated and possible that the overhang 24 extends toward the clips 14. The stem 22 may include a support structure 28 that extends a distance from the base 12 that is less than a distance between the contact surface 26 and the base 12. The overhang 24 may be inserted into the vehicle structure 100 to slidably connect the base 12 to the vehicle structure 100.

Referring to FIG. 2, the vehicle structure 100 may include a body 104 having an upper surface 106 and an opposite underside 108 (FIG. 6), and may define a pair of hook-receiving openings 110 and a pair of clip-receiving openings 112 that each extend through the upper surface 106 and the underside 108. The hook-receiving openings 110 may be sized and shaped to receive the hooks 16 of the mount 10, where the hooks 16 are insertable into the hook-receiving openings 110 for the contact surface 26 of the hooks 16 to contact the underside of the vehicle structure 100. The vehicle structure 100 is depicted as a stamped metal sheet, where the vehicle structure 100 may be, for example, a portion of a vehicle frame. However, it is contemplated and possible that any vehicle structure 100 may be used capable of supporting the mount, such as a floor, a roof, a tailgate, a hood, a door, a pillar, struts, a dashboard, an engine bay, or the like.

Figure 3:
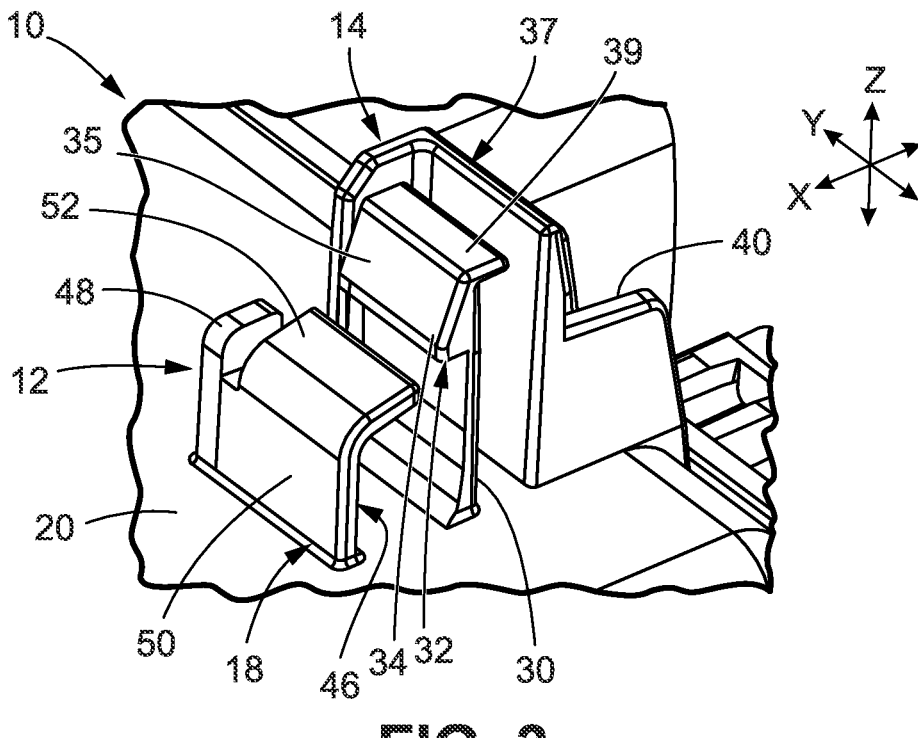
FIG. 3 schematically depicts a perspective view of a clip of the mount of FIG. 1, according to one or more embodiments shown and described herein.
Figure 4:
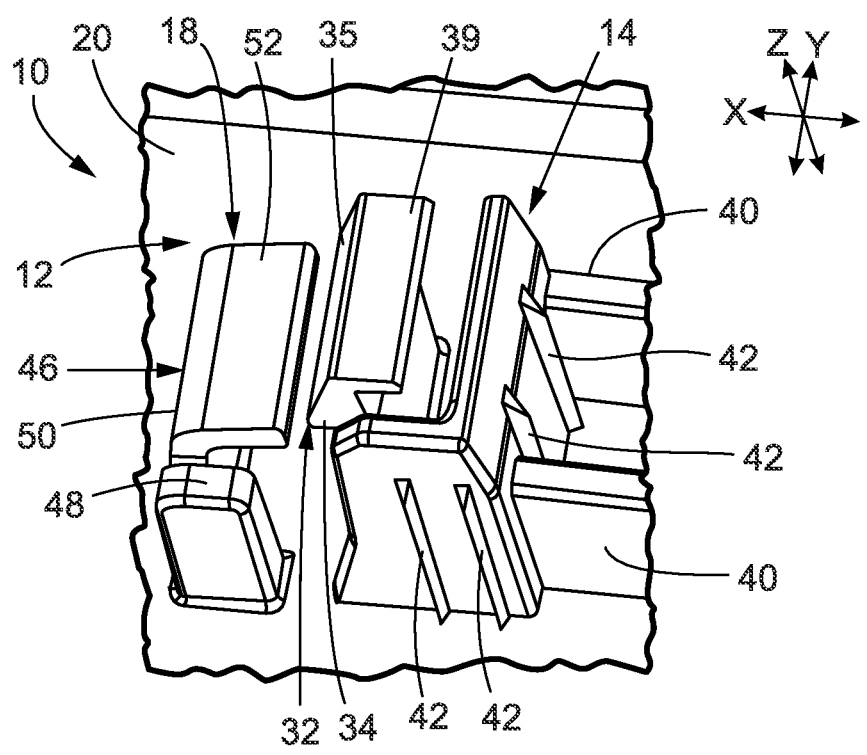
FIG. 4 schematically depicts another perspective view of the clip of FIG. 3, according to one or more embodiments shown and described herein.

Referring to FIGS. 3 and 4, each clip 14 may include a cantilever 30 with a snap 32 for constraining movement of the base 12 relative to the vehicle structure 100 in the Z-direction, and an L-shaped bracket 37 for constraining movement of the base 12 relative to the vehicle structure 100 in the Y-direction and the X-direction. The cantilever 30 may extend from the base 12 with the snap 32 coupled to the cantilever 30 to be spaced apart from the base 12. The cantilever 30 may be shaped and formed of a material to allow the cantilever 30 to bend when the clip 14 is inserted into the vehicle structure 100, and unbend to the original shape of the cantilever 30. The snap 32 may include an engagement surface 34 facing the base 12 that is configured to engage the vehicle structure 100 with a snap fit, and an angled surface 35 extending obliquely to the engagement surface 34. The angled surface 35 may contact a perimeter 114 of the clip-receiving opening 112 in the vehicle structure 100 when the clip 14 is inserted into the vehicle structure 100, and cause the cantilever 30 to bend, or deflect, until the snap 32 is fully inserted into the vehicle structure 100, where the engagement surface 34 then contacts the underside 108 of the vehicle structure 100. The snap 32 may further include an arm 39 extending from the snap 32 toward the L-shaped bracket 37 that is configured to limit a distance that the cantilever 30 bends by contacting the L-shaped bracket 37 when the cantilever 30 bends a predetermined distance.

The L-shaped bracket 37 is configured to brace against the perimeter 114 of the clip-receiving opening 112 in the vehicle structure 100 to constrain movement of the clip 14 relative to the vehicle structure 100 in the Y- and X-directions. The L-shaped bracket 37 may include a support structure 40 and crush ribbing 42. The support structure 40 may extend from the base 12 a distance that is less than a distance between the engagement surface 34 of the cantilevered snap 32 and the base 12, and may be a pair of arms that contact a side of the L-shaped bracket 37 opposite the cantilever 30. The crush ribbing 42 may weaken the structure of the L-shaped bracket 37 at the crush ribbing 42 to be configured to increase flexibility, or decrease rigidity, of the L-shaped bracket 37. The crush ribbing 42 may be depressions, slots, cutouts, or other reductions in material in the L-shaped bracket 37 that increase the flexibility of the L-shaped bracket 37.

The biasing members 18 may be coupled to the base 12 at a position adjacent each clip 14 and each hook 16, and may include a plastic spring 46 and a stop 48. The plastic spring 46 may be configured to bias the base 12 away from the vehicle structure 100, and may include a first extension 50 extending perpendicularly from the base 12, and a second extension 52 extending from the first extension 50 at an oblique angle toward the cantilevered snap 32. The second extension 52 contacts the outer surface 106 of the vehicle structure 100 when the mount 10 is attached to the vehicle structure 100, where the second extension 52 deflects toward the base 12 from contact with the vehicle structure 100 to bias the base 12 away from the vehicle structure 100. The stop 48 may extend from the first extension 50 partially in the direction of extension of the second extension 52, and extends a distance that is less than a distance that the second extension 52 extends from the first extension 50 to be configured to limit the compression, or deflection, of the second extension 52. In other words, when the second extension 52 deflects a predetermined distance, the stop 48 contacts the outer surface 106 of the vehicle structure 100 to prevent overbending, or breakage, of the second extension 52. However, it is contemplated and possible that the biasing member 18 may be any traditional biasing member for biasing the base 12 away from the vehicle structure 100, such as a coiled spring.

Each of the above-described components may be formed of any operable materials, such as plastic, metal, or the like, by any operable means for forming the components, such as blowmolding, casting, or the like. Any of the components may be formed separately and coupled together, or formed together.

Figure 5:
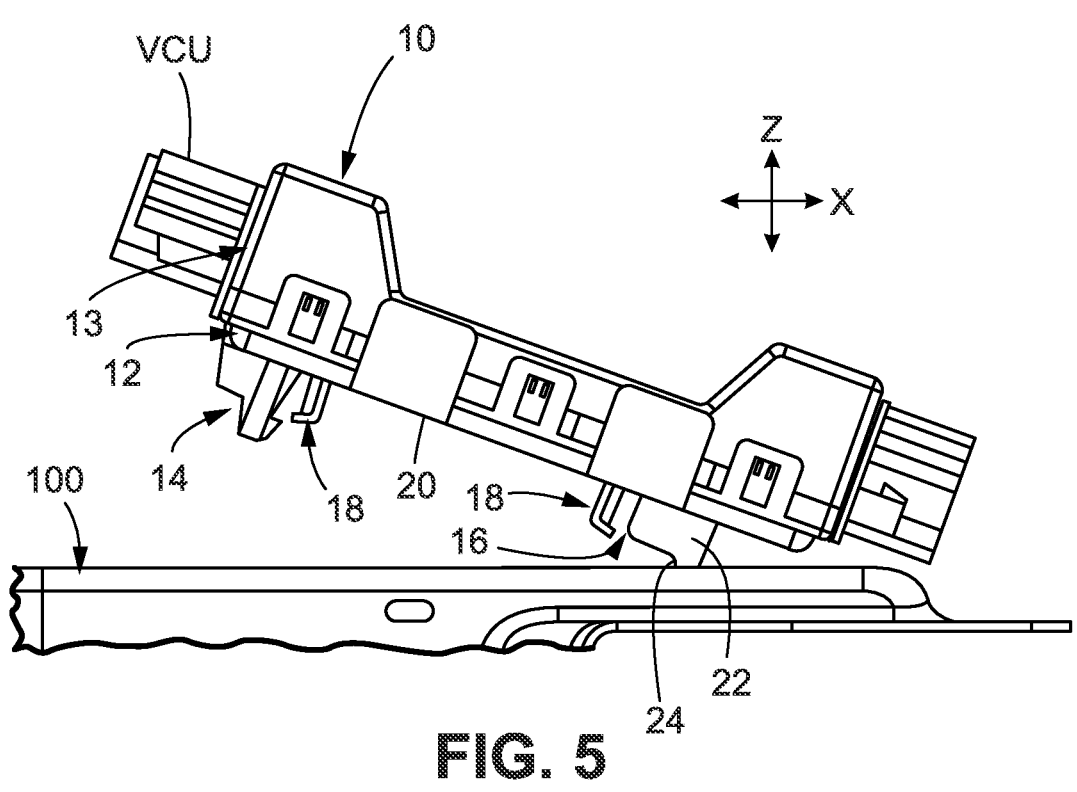
FIG. 5 schematically depicts a side view of hooks of the mount of FIG. 1 being inserted into the vehicle structure of FIG. 2, according to one or more embodiments shown and described herein.

The attachment operation for attaching the mount 10 to the vehicle structure 100 will now be described with reference to FIGS. 5 and 6. Referring first to FIG. 5, the hooks 16 may be inserted into the hook-receiving openings 110 in the vehicle structure 100 to constrain movement of the base 12 in the Y-direction, and the base 12 moved in the X-direction to position the clips 14 over the clip-receiving openings 112 so that when the clips 14 are moved toward the vehicle structure 100 in the Z-direction, the clips 14 are aligned to be inserted into the clip-receiving openings 112. The base 12 may be pivoted to move the clips 14 in the Z-direction toward the clip-receiving openings 112 to be inserted into the clip-receiving openings 112. As the clips 14 pass through the clip-receiving openings 112, the L-shaped brackets 37 contact the perimeter 114 of the clip-receiving openings 112, causing the L-shaped brackets 37 to deform at the crush ribbing 42. Additionally, the angled surface 35 of the snaps 32 contact the perimeter 114 of the clip-receiving openings 112 to bend the cantilever 30, permitting the snap 32 to pass through the clip-receiving opening 112. The bending of the cantilever 30 moves the arm 39 toward the L-shaped bracket 37, which may contact the L-shaped bracket 37 to prevent overbending of the cantilever 30.

Figure 6:
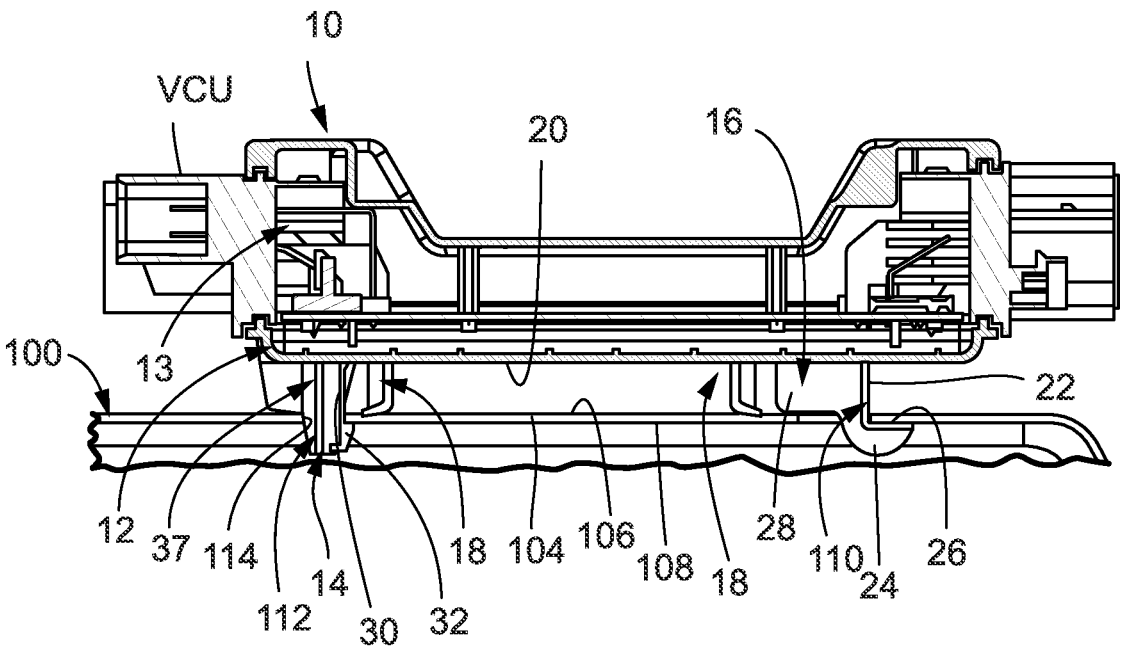
FIG. 6 schematically depicts a cross-sectional side view of the mount of FIG. 1 mounted to the vehicle structure of FIG. 2, according to one or more embodiments shown and described herein.

Referring to FIG. 6, once the clips 14 are inserted into the clip-receiving openings 112, the cantilever 30 may straighten to the original shape, positioning the contact surface 38 of the snap 32 in contact with the underside 108 of the vehicle structure 100 to constrain movement in the Z-direction. The second extension 52 of each plastic spring 18 may contact the outer surface 106 of the vehicle structure 100 and deflect to bias the base 12 away from the vehicle structure 100 in the Z-direction while the snap 32 engages the vehicle structure 100, thereby locating the base 12 relative to the vehicle structure 100 in the Z-direction. The L-shaped bracket 37 is positioned against the perimeter 114 of the clip-receiving opening 112 to constrain movement in the Y-direction and the X-direction.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative bases for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical application. Various combinations and modifications of the features consistent with the teachings of this disclosure, however, could be desired for particular applications or implementations.

"A", "an", and "the" as used herein refers to both singular and plural referents unless the context clearly dictates otherwise. By way of example, "a processor" programmed to perform various functions refers to one processor programmed to perform each and every function, or more than one processor collectively programmed to perform each of the various functions.

What is claimed is:

1. A mount for mounting a vehicle electric control module to a vehicle structure, the mount comprising:
   a base configured to couple to the vehicle electric control module;
   a clip coupled to the base, the clip comprising a cantilever extending from the base and a snap coupled to the cantilever to be spaced apart from the base, the snap comprising an engagement surface facing the base and configured to engage the vehicle structure with a snap fit,
   wherein the clip further comprises an L-shaped bracket configured to brace against the vehicle structure and constrain movement of the clip relative to the vehicle structure,
   wherein the clip further comprises an arm extending from the snap toward the L-shaped bracket; and
   a hook coupled to the base, the hook comprising a contact surface facing the base and configured to contact the vehicle structure;
   a biasing member configured to bias the base away from the vehicle structure,
   wherein the biasing member comprises a stop that limits compression of the biasing member.

2. The mount of claim 1, wherein the biasing member comprises a plastic spring.

3. The mount of claim 1, wherein the biasing member comprises a stop that limits compression of the biasing member.

4. The mount of claim 1, wherein the L-shaped bracket comprises a support structure extending from base a distance that is less than a distance between a lower surface of the snap and the base.

5. The mount of claim 1, wherein the L-shaped bracket comprises crush ribbing configured to increase flexibility of the L-shaped bracket.

6. The mount of claim 1, wherein the hook has a support structure that extends a distance from the base that is less than a distance between the contact surface and the base.

7. A mount for mounting a vehicle electric control module to a vehicle structure, the mount comprising:

a base configured to couple to the vehicle electric control module;

a clip coupled to the base, the clip comprising a cantilevered snap extending from the base and an L-shaped bracket, the cantilevered snap configured to constrain movement in a Z-direction relative to the vehicle structure, and the L-shaped bracket configured to constrain movement in an Y-direction and a X-direction relative to the vehicle structure; and a hook coupled to the base and configured to slidably connect to the vehicle structure;

wherein:

the biasing member comprises a stop that limits compression of the biasing member, the L-shaped bracket comprises a support structure extending from base a distance that is less than a distance between a lower surface of the cantilevered snap and the base, and crush ribbing configured to increase flexibility of the L-shaped bracket, and the clip further comprises an arm extending from the snap toward the L-shaped bracket.

8. The mount of claim 7, wherein the cantilevered snap comprises an engagement surface facing the base that is configured to engage an underside of the vehicle structure, and the hook comprises a contact surface facing the base that is configured to contact the underside of the vehicle structure.

9. The mount of claim 8, wherein the hook has a support structure that extends a distance from the base that is less than a distance between the contact surface and the base.

10. The mount of claim 7, further comprising a biasing member configured to bias the base away from the vehicle structure.

11. A mount for mounting a vehicle electric control module to a vehicle structure, the mount comprising:

a base configured to couple to the vehicle electric control module;

a hook coupled to the base and configured to slidably connect to the vehicle structure;

a clip coupled to the base, the clip comprising a cantilever extending from the base and a snap coupled to the cantilever to be spaced apart from the base, the snap comprising an engagement surface facing the base and configured to engage the vehicle structure; and a plastic spring coupled to the base and configured to bias the base away from the vehicle structure;

wherein the cantilevered comprises an engagement surface facing the base that is configured to engage an underside of the vehicle structure, and the hook comprises a contact surface facing the base that is configured to contact the underside of the vehicle structure;

wherein the clip further comprises an L-shaped bracket configured to brace against the vehicle structure and constrain movement of the clip relative to the vehicle structure;

wherein the clip further comprises an arm extending from the snap toward the L-shaped bracket.

12. The mount of claim 11, wherein the plastic spring comprises a stop that limits compression of the plastic spring.

13. The mount of claim 11, wherein the L-shaped bracket comprises a support structure extending from base a distance that is less than a distance between a lower surface of the snap and the base, and crush ribbing configured to increase flexibility of the L-shaped bracket.

* * * * *